United States Patent [19]

Malmborg et al.

[11] Patent Number: 4,476,357
[45] Date of Patent: Oct. 9, 1984

[54] SWITCHING APPARATUS EMPLOYING CONDUCTOR CONTRACTS ON A MOVABLE ELASTOMERIC MEMBER

[75] Inventors: Floyd L. Malmborg, Brookfield Ctr.; Stanley S. Strengowski, Monroe, both of Conn.

[73] Assignee: T-Bar Incorporated, Wilton, Conn.

[21] Appl. No.: 425,245

[22] Filed: Sep. 28, 1982

[51] Int. Cl.³ .......................................... H01R 19/50
[52] U.S. Cl. .................................. 200/51.09; 200/292; 200/153 LA; 200/243; 200/51 R; 200/51.1; 200/241; 339/19; 179/96
[58] Field of Search ........ 200/264, 51 R, 51.01–51.07, 200/51.09–51.10, 292, 243, 275, 241, 242, 329, 153 LA; 179/1 PC, 95, 96, 98; 339/17 LC, 17 LM, 17 M, DIG. 3, 19, 222

[56] References Cited

U.S. PATENT DOCUMENTS

| | | | |
|---|---|---|---|
| 2,748,210 | 5/1956 | Frank | 200/243 |
| 3,721,940 | 3/1973 | Michel et al. | 200/292 X |
| 3,735,068 | 5/1973 | Yanaga et al. | 200/264 X |
| 3,950,627 | 4/1976 | Murata et al. | 200/264 X |
| 3,998,512 | 12/1976 | Anhalt et al. | 339/DIG. 3 |
| 4,037,186 | 7/1977 | Palmer et al. | 200/51.09 X |
| 4,154,994 | 5/1979 | Seiden et al. | 200/51.07 |
| 4,237,352 | 12/1980 | Seiden | 200/51.03 |
| 4,256,936 | 3/1981 | Lancaster | 200/51.07 |
| 4,259,551 | 3/1981 | Ohtani et al. | 200/5 A |
| 4,363,941 | 12/1982 | Nelson | 200/292 |
| 4,368,369 | 1/1983 | Matsumoto et al. | 200/292 |

Primary Examiner—Charles E. Phillips
Assistant Examiner—Ernest G. Cusick
Attorney, Agent, or Firm—John C. Dorfman

[57] ABSTRACT

An integral switch means on a printed circuit board is provided by a plurality of parallel conductor segments having insulating gaps which are aligned in a column transverse to the conductor tracks. Posts supported on the printed circuit board support and align a rigid support member for an elastomeric member having a plurality of conductor strips positioned to separately bridge the respective gaps of the connector segments on a printed circuit board when the elastomeric member is positioned against the printed circuit board. Spring biasing means extends between support posts and the rigid support member for normally urging the elastomeric member into the printed circuit board in position to close the switches. Actuator means is movably supported relative to the printed circuit board to cooperate with the support member to move the elastomeric member against the bias of the spring away from the printed circuit board. Preferably the actuator means is contacted by a plug when the plug is inserted into a receptacle, thereby opening the switches.

7 Claims, 13 Drawing Figures

SWITCHING APPARATUS EMPLOYING CONDUCTOR CONTRACTS ON A MOVABLE ELASTOMERIC MEMBER

BACKGROUND OF THE INVENTION

The present invention relates generally to switching apparatus and, more particularly, to a switching apparatus which employs a metalized elastomeric member for simultaneously making or breaking electrical connections between a plurality of pairs of conductors.

DESCRIPTION OF THE PRIOR ART

Multiple line connections between pieces of equipment, particularly in connection with complex electronic communications and data processing systems, has been quite common. In this context, the ability to simultaneously make or break (switch) electrical connections between each pair of a plurality of pairs of electrical conductors has become very important. In a data processing system, for example, it is highly desirable to be able to conveniently interconnect particular data communications devices, such as communications modems or multiplexers, with various data terminal devices, such as different front end processors or central processing units. Since multiple conductors or lines (typically as many as 25) are needed for the transmission of the requisite control and data signals between such data communication and data terminal devices, simultaneous switching (making or breaking of all of the requisite electrical connections) is required to facilitate such interconnections with a minimum of disruption to the data processing system.

Typically, a patch assembly, comprised of a plurality of patch modules, is employed in a data processing system to facilitate the rapid interconnection of data communications devices with the various data terminal devices and vice versa. Such a patch assembly provides a convenient location for the interconnection of such devices in a variety of different configurations. U.S. Pat. No. 4,154,994 entitled "Patch Module" and U.S. Pat. No. 4,237,352 entitled "Patch Module for Connecting to Off-Line Transmission Lines of a Switchably Selected Pair of Transmission Lines", both of which are assigned to T-Bar, Inc., the assignee of the present invention, show and describe patch modules of the type presently in use in data processing systems.

In a patch module of the type described in the aforementioned patents, a set of normally closed mechanical switches connects a multi-conductor line from a particular data terminal equipment (DTE) device to a multi-conductor line from a particular data communications equipment (DCE) device. Typically, the multi-conductor lines are connected to the patch module through the use of standard 25-pin EIA RS-232 connectors located at the back of the patch module. The patch module, in effect, provides a straight-through connection between the DTE connector (line) and the DCE connector (line) as long as the set of switches remain closed. The insertion of a wand (or other type of patching device) into a DCE or DTE receptacle at the front of the patch module causes the normally closed set of switches to open and break the multi-conductor connection between the DTE line and the DCE line which had been provided by the patch module. The rotation of the inserted wand within the receptacle brings independent multiple contacts on the wand into engagement with corresponding multiple fixed contacts within the receptacle which are connected to either the DTE line or the DCE line, depending upon which receptacle the wand is inserted into. The multiple contacts on the wand are each connected to a separate conductor in a multi-conductor patch lead. The other end of the conductors in the patch lead are connected to individual contacts of a second wand to form a "patch cord". Usually the wands are identical and interchangeable with contacts on the first wand connected to corresponding contacts on the second wand. By employing a plurality of such patch modules in one location, virtually any combination or permutation of DCE/DTE device interconnection within a given system may be conveniently configured by using one or more such patch cords to connect a DCE line from one patch module to a DTE line from any other patch module.

While the prior art patch modules of the type described in the aforementioned patents have been shown to be extremely reliable in such multi-line patching applications, they are relatively costly to produce, primarily because of the gold, or other precious metals, which are employed in the switches and other contacts. In addition, due primarily to the necessary complexity involved in the mechanical, metallic spring member type multiple switches and the related actuator structures, the prior art patch modules occupy a relatively large area and, thus, are not capable of achieving the compact, high density switching which is required in many present day applications.

SUMMARY OF THE INVENTION

The present invention provides a switching apparatus which employs a metalized elastomeric switching member to provide low cost, high density, multiple conductor switching and which may be used in connection with such a patch module.

Briefly stated, the present invention comprises a switching apparatus for making or breaking electrical connections simultaneously. A conductor support member is provided for supporting a plurality of generally parallel conductor segments each having an insulating gap such that the gaps are aligned in a column transverse to the conductor segments. An elastomeric member having a plurality of generally parallel conductor strips is provided to bridge the gaps between the conductor segments. The elastomeric member is supported and aligned relative to the conductor support member by support means which permits movements of the elastomeric member toward and away from the conductor support member. Biasing means are provided for normally urging the elastomeric member into one of two positions, the conductor strips engaging the conductor segments in one position to provide electrical connections through the conductor segments and the conductor strips being separated from the conductor segments on at least one side of the gaps in the other position to prevent electrical connections across the gaps between the parts of the conductor segments. Actuator means, movably supported relative to the conductor support member and cooperable with the elastomeric member, are provided for moving the elastomeric member against the bias of the biasing means and into the other of the two positions.

BRIEF DESCRIPTION OF THE DRAWINGS

The foregoing summary, as well as the following detailed description of a preferred embodiment of the invention, will be better understood when read in conjunction with the appended drawings, in which.

DESCRIPTION OF A PREFERRED EMBODIMENT

Figure 1:
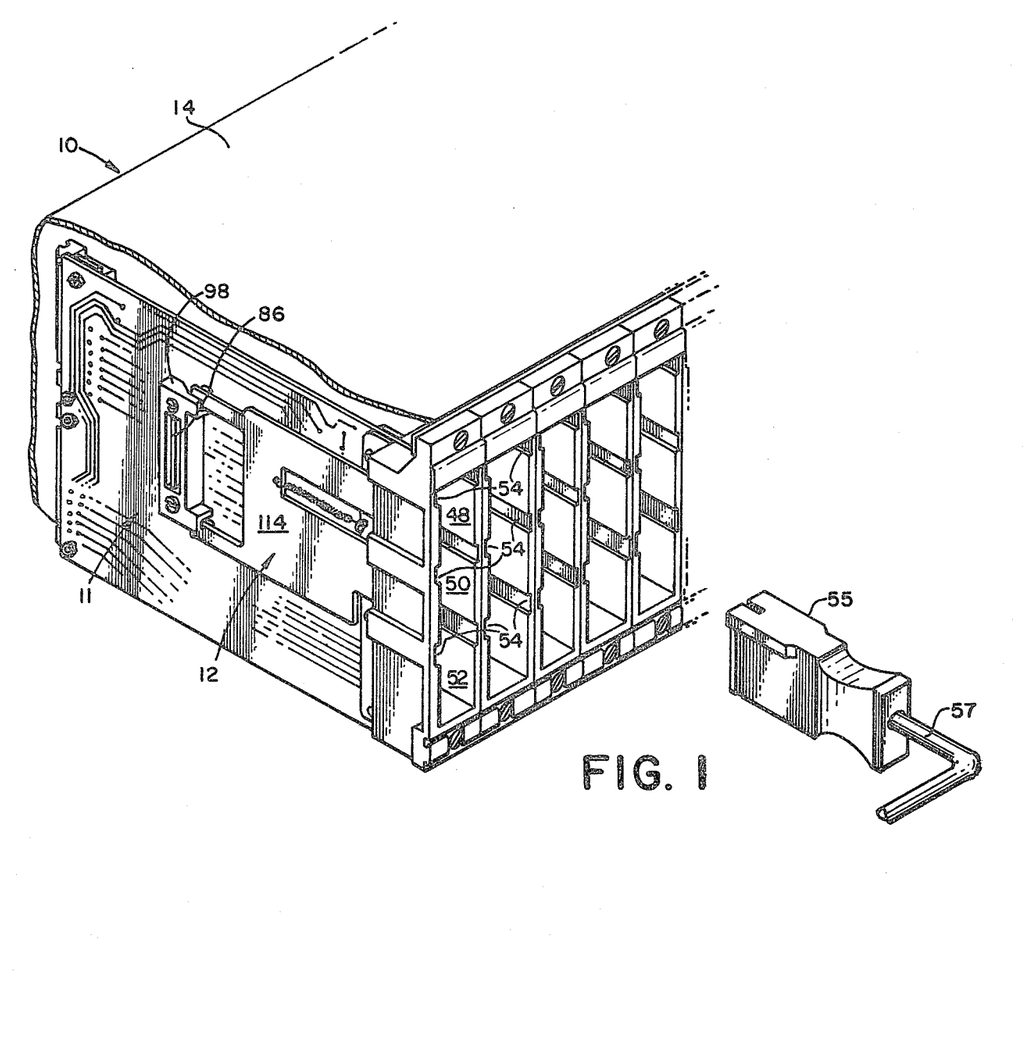
FIG. 1 is a perspective view, partially broken away, of an array of patch module units employing switching apparatus in accordance with the present invention.

Referring to the drawings, and particularly to FIG. 1, there is shown a portion of a patch assembly 10 comprised of a plurality of identical individual patch module units 12 (five of which are shown) mounted in parallel within a housing 14. The patch module units 12 each include a conductor support member, in the present embodiment, a printed circuit board 11 (FIG. 3A and 3B), both sides of which provide circuitry and attached coupling hardware, described below. The housing 14 may be of a standard design and construction typical of data processing equipment housings. As discussed above, the patch assembly 10 is typically employed in a data processing system to facilitate the rapid multiple line interconnection of various data communications equipment or devices with various data terminal equipment or devices through the use of multiple conductor patch cords or other such interconnection devices.

Figure 10A:
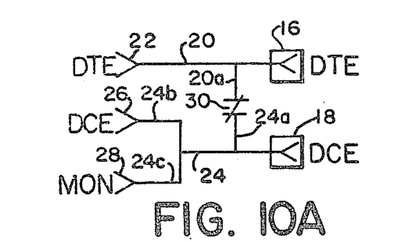
FIG. 10A is a schematic diagram of the circuitry of the patch module unit of FIG. 2 in the unpatched configuration.

Referring now to FIG. 10A, there is shown a schematic diagram of the illustrative operation of a representative conductor connection within a single patch module unit 12. For simplification of the schematic diagram, only single conductors are illustrated, it being understood that each conductor shown represents one of many conductors and related circuitry.

The back end of the patch module unit 12 includes two EIA RS-232 type 25-pin female cable connectors 16 and 18 (seen in FIGS. 2, 4 and 5) which are plugged into corresponding male connectors (not shown) within the patch assembly housing 14. Connectors 16 and 18 terminate cables when the patch module unit 12 is installed within the patch assembly housing 14. When installed within the patch assembly housing 14, connector 16 is connected by a suitable multiple conductor cable (not fully shown) with a particular piece of data terminal equipment (DTE) associated with the particular patch module unit and connector 18 is connected by a suitable multiple conductor cable (not shown) with a particular piece of data communications equipment (DCE) associated with the particular patch module unit 12. As shown, a line 20, representative of a plurality of lines, only one of which is shown for clarity, extends from the DTE connector 16 to a second DTE connector 22, in this embodiment a printed circuit board edge connector, located on the front end of the patch module unit 12. Likewise, a plurality of lines shown as a single line 24 extends from the DCE connector 18 via line 24b to a corresponding DCE board edge connector 26 on the front end of the patch module unit 12. The DCE connector 18 is also interconnected via a plurality of lines, represented by lines 24 and 24c, with a third monitor (MON) board edge connector 28 which is also located on the front end of the patch module unit 12.

The DTE connector 16 and the DCE connector 18 are similarly connected via lines 20/20a and 24/24a, respectively, to either side of a switching apparatus 30. As shown on the unpatched configuration of FIG. 10A, the switching apparatus 30 is normally closed to establish a direct pin-by-pin electrical connection between the DTE connector 16 and the DCE connector 18. In this manner, the particular DTE device associated with the patch module unit 12 is normally connected through the patch module unit 12 to the corresponding particular DTE device associated with the patch module unit 12.

As discussed briefly above, it may be desirable to disconnect a particular piece of data terminal equipment from its normally corresponding data communications equipment (or vice versa) and to connect the data terminal equipment to a different piece of data communication equipment. Such action may be conveniently accomplished by the patch assembly 10 by patching between the respective DCE/DTE board edge connectors of various patch modules units to, in effect, reconfigure the DCE/DTE circuits.

Figure 10B:
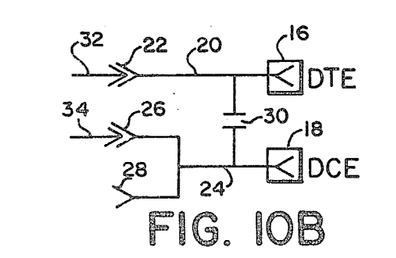
FIG. 10B is a schematic diagram of the circuitry of the patch module unit of FIG. 2 in the patched configuration.

FIG. 10B provides a schematic illustration of the patch module unit 12 of FIG. 10A in the patched configuration, but showing alternative patch cord combinations that normally would not be used simultaneously. As shown, the insertion of a suitable plug means or plug of patch cord 32 or 34 into mating engagement with either the DTE board edge connector 22 or the DCE board edge connector 26, causes the switching apparatus 30 to open, thereby breaking the direct connection shown in FIG. 10A between the DTE connector 16 and the DCE connector 18. Assuming DTE board edge connector 22 is the connection made, a similar connector on the other end (not shown) of patch cord 32 may then be inserted into the DCE board edge connector receptacle or any other patch module unit (see FIG. 1) to provide a desired DTE/DCE connection. Likewise, in the alternative case of patch cord 34, the other end (not shown) may be inserted into any other DTE board edge connector receptacle to provide a desired DCE/DTE connection.

The insertion of a plug means of a patch cord (not shown) into the receptacle for and into engagement with the MON board edge connector 28 does not cause the switching apparatus 30 to open. The MON board edge connector 28 may be used to conveniently monitor the signals passing through the patch module unit 12 between the DTE connector 16 and the DCE connector 18 without any interruption thereof.

Figure 2:
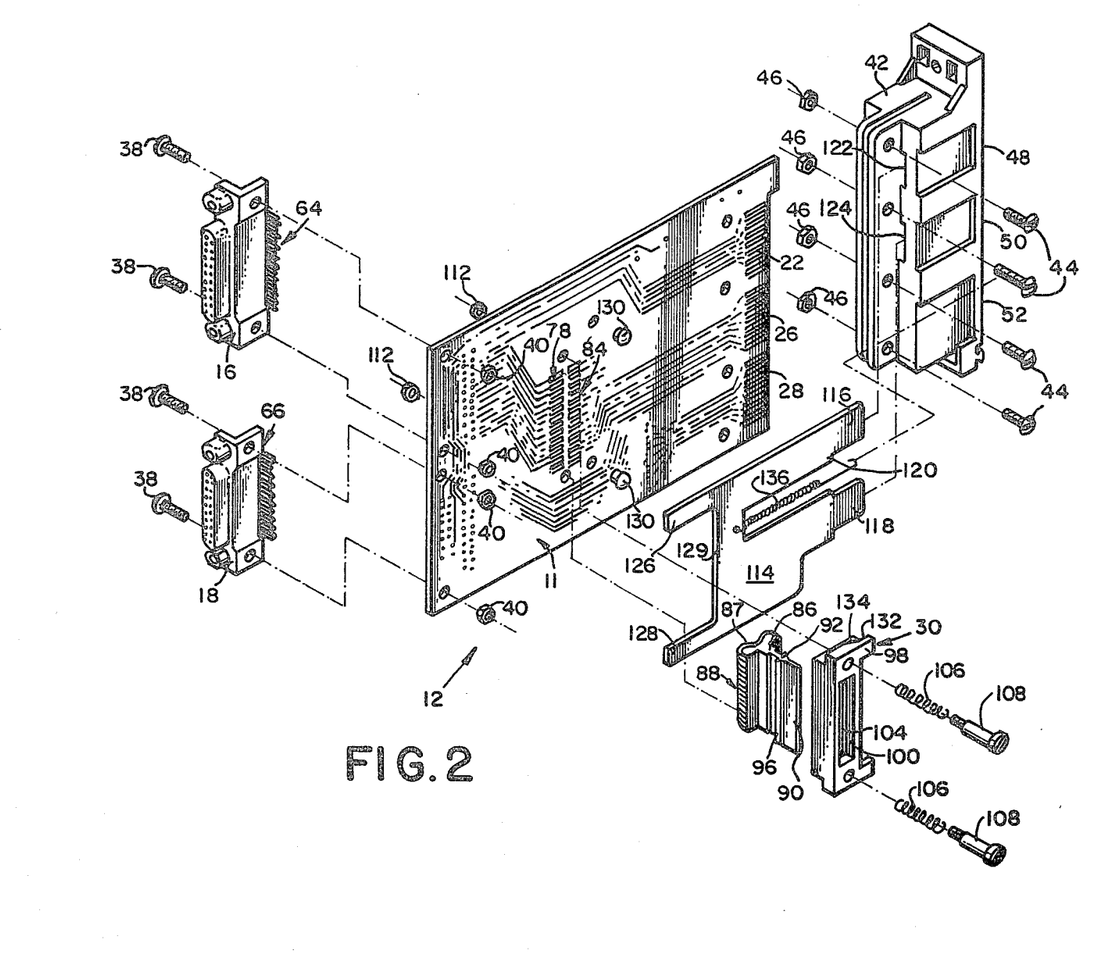
FIG. 2 is an exploded perspective view of one of the patch module units of FIG. 1.

Referring now to FIG. 2, there is shown an exploded perspective view of a single patch module unit 12. The patch module unit 12 includes the DTE and DCE standard EIA RS-232 type cable connectors 16 and 18, respectively, which are attached at the back end of printed circuit board 11 by suitable screws and nuts 38 and 40.

In the present embodiment, the DTE, DCE and MON board edge connectors 22, 26 and 28 are located on the front end of the printed circuit board 11 and each comprise twenty-four enlarged area terminal lands, twelve of which are located on each side of the printed circuit board 11 to form a standard printed circuit board edge connector to receive an board edge plug of the type well known in the art. A molded frame member 42, comprised of a rigid non-conductive material such as plastic, is attached to the front end of the printed circuit board 11 by means of suitable screws and nuts 44 and 46, respectively. Frame member 42 provides three plug receptacle means or board edge receptacles 48, 50 and 52 which receive the board edge plugs and guide them into proper registration with the board edge connectors on the both sides of the printed circuit board 11. The receptacles respectively surround and generally enclose each of the three board edge connectors 22, 26 and 28 and comprise three generally rectangular access openings (best shown on FIG. 1) for providing patch cord access to the respective DTE, DCE and MON board edge connectors 22, 26 and 28, respectively. Each of the receptacles 48, 50 and 52 includes a corresponding generally rectangular patch cord plug keyway 54 to insure that any plug inserted therein is properly oriented, aligned and indexed with its respective connections of the board edge connector.

A typical patch cord having an appropriate plug means or plug 55 for interconnecting with any of the three board edge connectors 22, 26 and 28 is shown on FIG. 1. The patch cord plug 55 is of a type well known in the art and has a suitable flange portion which engages the connector keyway 54 to assure proper alignment, connection to and orientation upon being inserted into one of the patch cord receptacles 48, 50 and 52. In addition, the patch cord plug 55 has a plurality of contacts (not shown) for engagement with the board edge connectors 22, 26 or 28. The patch cord plug 55 may be connected via a multiple conductor line or cable 57 to a corresponding patch cord plug (not shown) for "patching" or interconnecting DCE and DTE devices as described in connection with FIGS. 10A and 10B above.

Figure 3A:
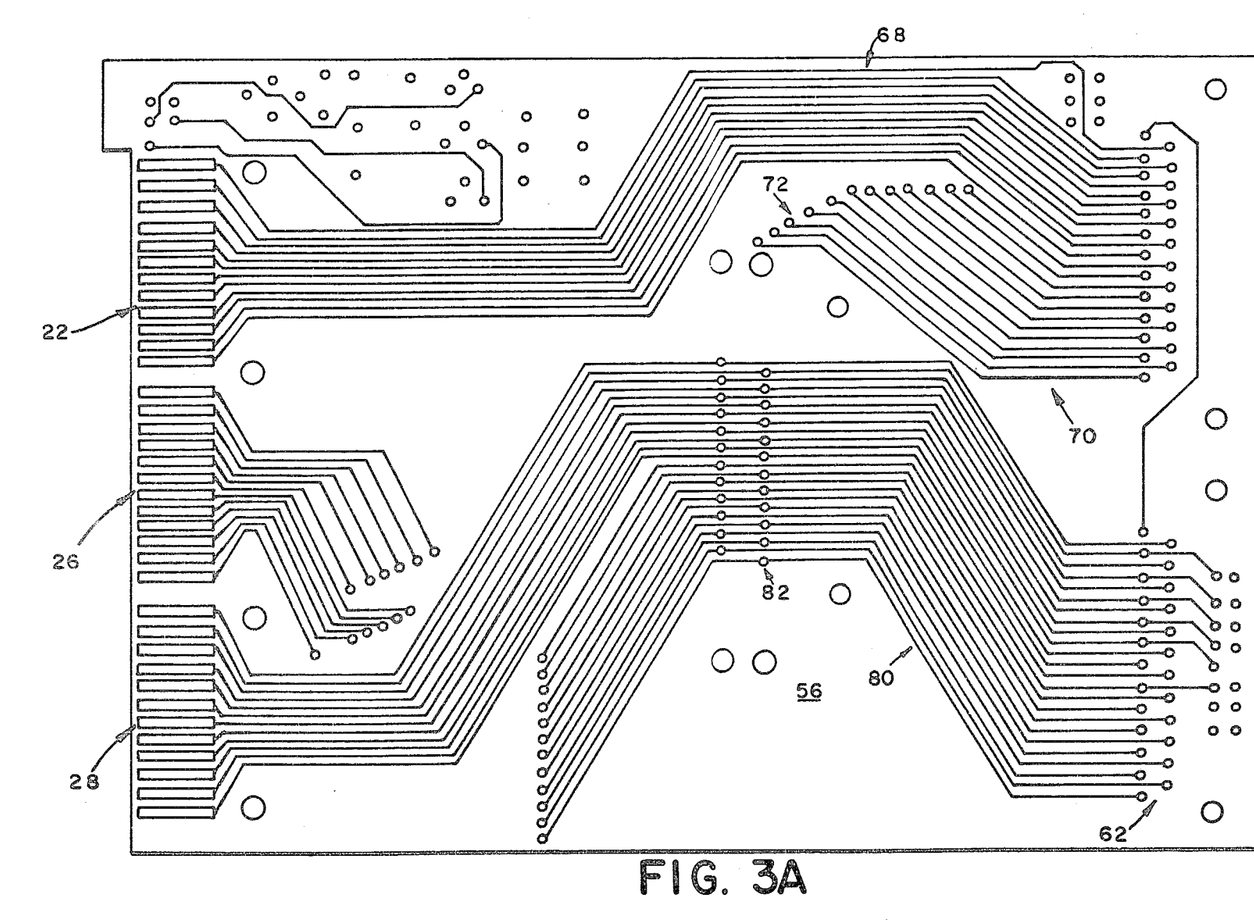
FIG. 3A is a plan view of the printed circuit board of the patch module unit of FIG. 2 showing the circuit layout of the top side of the printed circuit board.
Figure 3B:
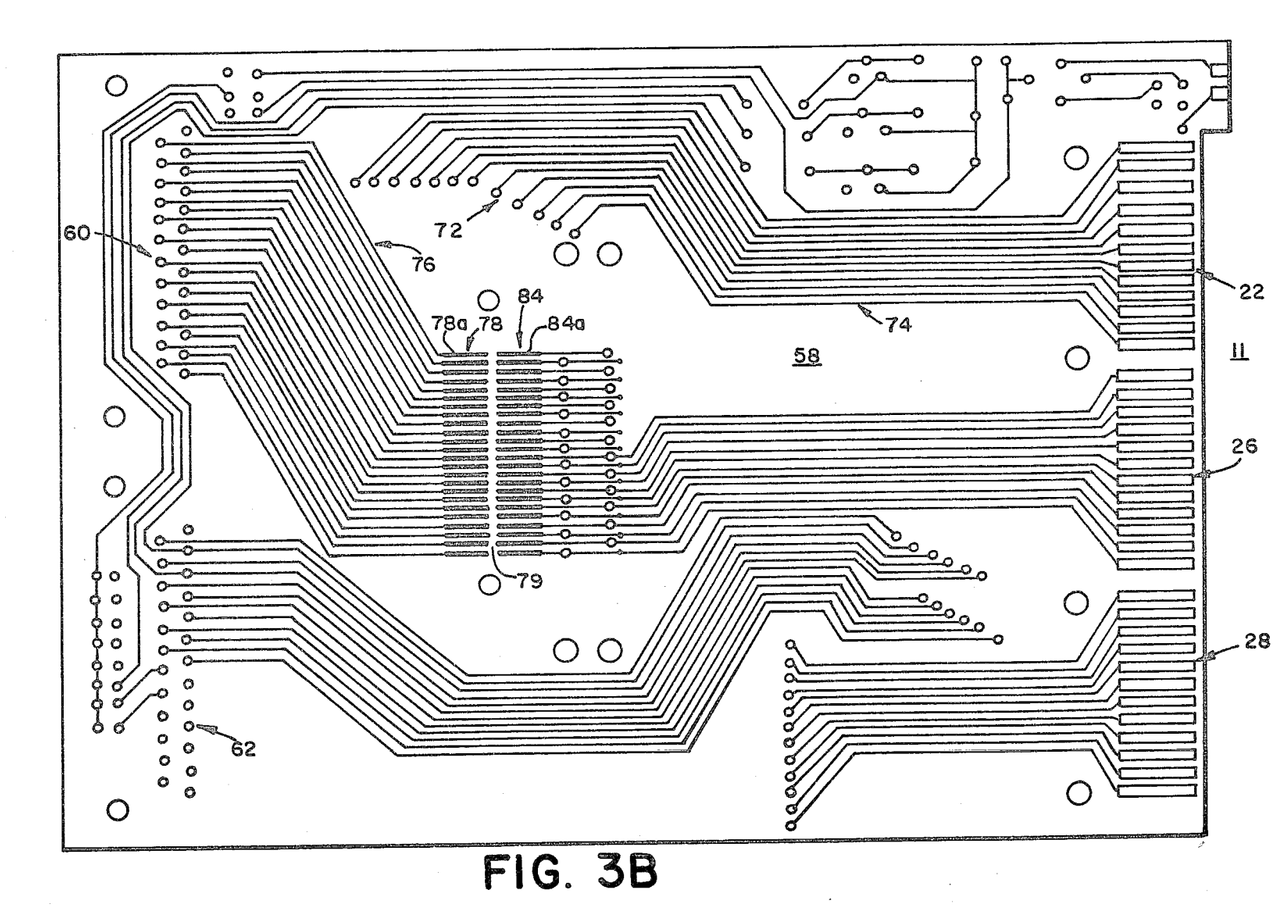
FIG. 3B is a reverse plan view of the printed circuit board of FIG. 3A showing the circuit layout of the bottom side of the printed circuit board.

The patch module unit printed circuit board 11 is of the standard printed circuit board design and construction and includes a plurality of electrically conductive tracks of the standard type employed in connection with such printed circuit boards. In addition, the printed circuit board 11 includes various other standard components such as feedthrough terminals and enlarged area terminal lands. Referring now to FIG. 3A and FIG. 3B, there is shown both a plan view and reverse plan view of the layout of the printed circuit board 11. For the purpose of facilitating the present description of the circuit board layout, the side of the printed circuit board shown on FIG. 3A will be referred to as the top side 56 and the side of the printed circuit board shown on FIG. 3B will be referred to as the bottom side 58. The printed circuit board as shown on FIG. 3A and FIG. 3B do not have the EIA RS-232 DCE and DTE connectors 16 and 18 attached. However, the board does contain two sets of twenty-five suitably positioned and aligned feedthrough terminals 60 and 62 for the purpose of receiving the twenty-five pins 64 and 66, respectively (best seen on FIGS. 2 and 6) of the DTE and DCE connectors 16 and 18, respectively.

The combination of the various printed circuit conductive tracks, feedthrough terminals and enlarged terminal lands located on both the top and bottom sides 56 and 58 of the printed circuit board 11 cooperate to establish the multiple conductor paths which are shown schematically on FIG. 10A and FIG. 10B and have been described briefly above. A complete, detailed description of the entire layout of both sides of the printed circuit board will not be set forth since it is believed that the information shown on FIG. 3A and FIG. 3B is in sufficient detail to enable one skilled in the art to trace and fully understand the circuitry. For example, it is apparent from FIG. 3A and FIG. 3B that the twenty-four conductor connection between the DTE connector 16 and the board edge DTE connector 22, which is shown schematically on FIG. 10A by a single line 20, is implemented on the printed circuit board 11 by a combination of twelve generally parallel conductive tracks (shown generally as 68) on the printed circuit board top side 56 which extend directly from the DTE feedthrough terminals 60 to the top side terminal lands comprising the DTE board edge connector 22 and twelve generally parallel conductive tracks (shown generally as 70) which originate at the DTE feedthrough terminals 60 on the printed circuit board top side 56, are fed through the printed circuit board by twelve feedthrough terminals 72, and continue as twelve generally parallel conductive tracks (shown generally as 74) along the printed circuit board bottom side 58 (FIG. 3B) to the bottom side terminal lands which comprise the remainder of the DTE board edge connector 22. The implementation of the connections between the DCE connector 18 and the DCE and MON board edge connectors 26 and 28 on the printed circuit board 11 can be ascertained from FIG. 3A and FIG. 3B if desired.

The connection between the DTE connector 16 and the first side of the switching apparatus 30, which is shown schematically on FIG. 10A by lines 20 and 20a, is implemented on the printed circuit board 11 by a first set of generally parallel electrically conductive tracks 76 which extend along the printed circuit board bottom side 58 from the DTE connector feedthrough terminals 60 to a corresponding set of terminal lands 78. In the present embodiment, the first set of conductive tracks 76 comprises 24 tracks, a single track corresponding to each of pins 2-25 of the DTE EIA RS-232 connector 16. Correspondingly, the first set of terminal lands 78 in the present embodiment comprises 24 such terminal lands, one land comprising a first or terminal end of each of the tracks of the first set of conductive tracks 76. For purposes which will hereinafter become apparent, the terminal lands 78 are coated or plated with a highly conductive material such as gold.

As shown in FIG. 3B, the lands 78 are generally parallel to each other and are spaced apart from each other, their unconnected or terminal ends being generally aligned with each other to form a first column of lands. Each of the lands 78 is shown on FIG. 3B as being slightly wider than the connecting conductive tracks 76 but the lands 78 could also be of the same width or narrower than the conductive tracks 76, if desired.

The connection between the DCE connector 18 and the second side of the switching apparatus 30, which is shown schematically on FIG. 10A by lines 24 and 24a, is implemented on the printed circuit board 11 by a second set of generally parallel conductive tracks 80 on the printed circuit board top side 56 which extend from the DCE connector feedthrough terminals 62 to a set of feedthrough terminals 82. The feedthrough terminals 82 are connected on the printed circuit board bottom side 58 to a second set of terminal lands 84. Again, in the present embodiment, the second set of conductive tracks 80 and the second set of terminal lands 84 comprise 24 individual tracks and lands, one corresponding to each of pins 2-25 of the DCE EIA RS-232 connector 18.

The second set of terminal lands 84 are also generally parallel to each other and are spaced apart from each other with their terminal or unconnected ends being aligned with each other to form a second column of lands. As shown on FIG. 3B, the second set of terminal lands 84 is aligned in one-by-one registry with the first set of terminal lands 78 with an electrically insulating gap 79 between the sets of terminal lands so that each individual land of the first set of lands is aligned end-to-end with a corresponding individual land of the second set of lands 84 to form a plurality (24 in the present embodiment) of conductor segments or conductor pairs, each conductor pair being associated with a correspondingly specific numbered pin on both the DTE and DCE connectors 16 and 18. For example, the left land in each of the sets of terminal lands, identified as 78a (connected to pin 14 of the DTE connector 16) and 84a (connected to pin 14 of the DCE connector 18), respectively, forms one of the conductive pairs. The other 23 conductive pairs are formed accordingly to correspond to numbered pins 2-13 and 15-25 on the DTE and DCE connectors 16 and 18.

Figures 5, 6:
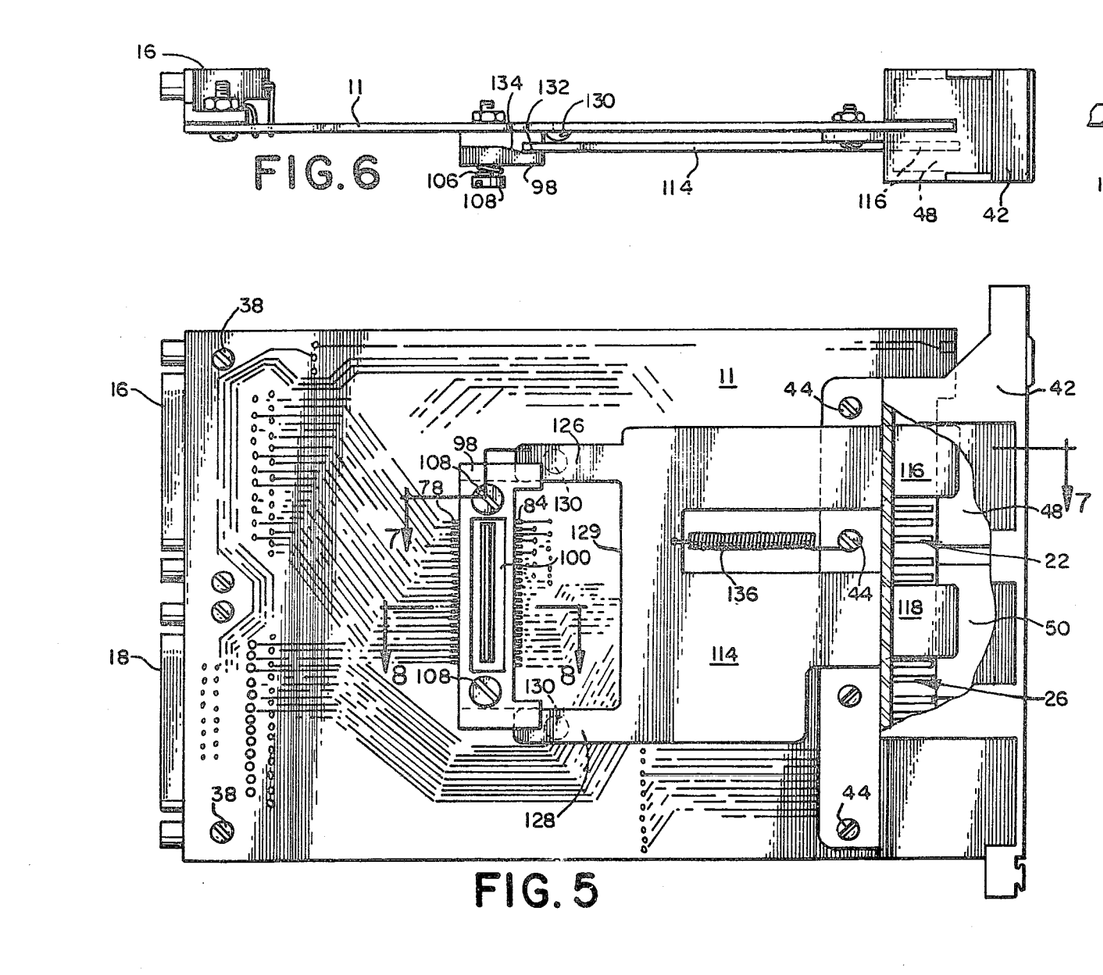
FIG. 5 is a reverse plan view of the patch module unit of FIG. 2 showing the bottom side of the printed circuit board with the attached connector hardware and switching apparatus.
FIG. 6 is a side elevation view of the patch module unit of FIG. 5.
Figure 8:
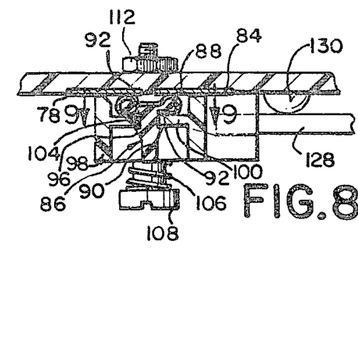
FIG. 8 is a slightly enlarged sectional view of the switching apparatus portion of the patch module unit taken along line 8—8 of FIG. 5 inverted to correspond to the orientation of FIG. 6.

Referring now to FIGS. 2, 5 and 8, it is apparent that the switching apparatus 30 functions (as schematically shown on FIG. 10A and FIG. 10B) to make or break the electrical connections simultaneously between pins 2-13 and 15-25 of the DTE and DCE connectors 16 and 18 by making or breaking the connection ("bridging" the gap 79) between the 24 conductor segments or pairs formed by the first and second sets of lands 78 and 84 respectively, and the gaps 79 therebetween. The switching apparatus 30 comprises an irregularly shaped elastomeric member 86 which, as seen in FIG. 8, is shaped generally like a "T" in cross section, the cross bar 87 of the "T" being generally rounded, or domed, and including semi-cylindrical ridges 87a and 87b at each end of the top face which is opposed and generally parallel to the circuit board 11 in use. A plurality of thin, closely spaced, generally parallel bridges or conductor strips 88 are supported on the top face of the elastomeric member 86. The conductor strips 88 may be copperplated with any of the known electrical contact materials, such as gold. The conductor strips 88 may be formed, for example, either by mechanically adhering fine wires to the elastomeric member 86 or by using printed circuit techniques to etch the wires directly onto the elastomeric member 86, or in any other suitable way. In the present embodiment (as best shown on FIG. 9), the conductor strips are approximately 0.004 inches wide with approximately 0.004 inches of spacing between strips. When the elastomeric member 86 contacts the printed circuit board 11 as shown on FIGS. 8 and 8A, the conductor strips 88 are generally orthogonal to the terminal lands 78 and 84, in particular those portions of the strips extending over the ridges 87a and 87b, physically contact or engage the first and second sets of lands 78 and 84 to bridge the gap 79 therebetween and thereby provide a direct electrical connection between the corresponding lands of each of the conductor pairs. In the present embodiment, the lands of the first and second sets are approximately 0.03 inches wide with approximately 0.02 inches of spacing between lands. Thus, it is apparent that in the closed contact condition corresponding lands of each conductor pair are engaged with at least one and as many as four individual conductor strips 88 to provide positive electrical contact therebetween. In addition, the ratio between the conductor strips width and spacing and the land width and spacing is such that precise alignment between the elastomeric member 86 and the first and second sets of lands 78 and 84 is not required and a certain amount of lateral shift causing misalignment is permissible. Furthermore, while parallelism between the conductor strips and the lands 78 and 84 is sought, a small amount of cocking of the elastomeric member 86 may be tolerated without making undesired cross connections.

In the present embodiment, the elastomeric member 86 is comprised of silicone rubber but may be of any other suitable elastomeric material having similar resilient properties. The elastomeric member 86 is long enough to allow for a sufficient number of conductor strips 88 to provide good electrical contact between all of the lands of both the first and second sets of lands 78 and 84. The elastomeric member 86 further includes a relatively flat leg portion 90 connected to the cross bar 87 having two extensions 92 generally parallel and spaced apart outwardly from the cross bar 87.

An elongated generally rectangular support means or housing 98 is provided to retain the elastomeric member 86. The support means or housing 98 is comprised of a relatively rigid non-conductive material such as a plastic resin. The housing 98 is generally "H" shaped in cross section as shown on FIG. 8. Through the cross bar 100 of the housing 98 extends an elongated slot 104 approximately the same length as the elastomeric member 86 and of such width as to snugly pass the elastomeric member leg portion 90. As shown on FIGS. 8 and 8A, the elastomeric member 86 is installed within the housing slot 104, and is held firmly in place between the two outward extensions 92 from leg 90. The surfaces of the extensions 92 opposite from the shoulders have beveled faces 96 to facilitate yielding and compression of the extensions 92 during installation of the elastomeric member 86 into the housing slot 104.

When the elastomeric member 86 is installed within the housing 98, the conductor strips 88 extend slightly below the bottom surface of the housing 98. When the housing 98 is urged toward the printed circuit board 11 for engagement therewith, as shown on FIGS. 8 and 8A, the conductor strips 88 and particularly the respective ridge portions 87a and 87b contact the first and second sets of lands 78 and 84. As the housing 98 and elastomeric member 86 are further urged downwardly toward the printed circuit board 11, there is a rocking of the housing 98 and the outer ridges 87a and 87b of the cross bar 87 of the elastomeric member 86 both tending to produce a sliding, rubbing or wiping of a portion of the conductor strips 88 against the surface of the first and second sets of lands 78 and 84. The deformation of the outer ridges 87a and 87b of the first face of the elastomeric member 86 continues until such time as the bottom surface of the housing 98 contacts the surface of the printed circuit board 11 or until limits of deformation and deflection of the cross bar 87 of the elastomeric member are reached. Correspondingly, a similar rubbing or wiping action occurs between the conductor strips 88 and the first and second sets of lands 78 and 84 as the housing 98 and elastomeric member 86 are moved upwardly away from the printed circuit board 11 as will hereinafter be described. In this manner, the above-described wiping action keeps both the first and second sets of lands 78 and 84 and the conductive strips 88 clean in order to provide for positive electrical contact therebetween. In addition, the outer edges of the cross bar 87 of the resilient elastomeric member 86 which are deflected or deformed are urged by the elastomeric properties to return to their original undeformed position, thereby urging the conductor strips 88 downwardly against the first and second pairs of lands 78 and 84 to further help provide good electrical contact therebetween.

Figure 8A:
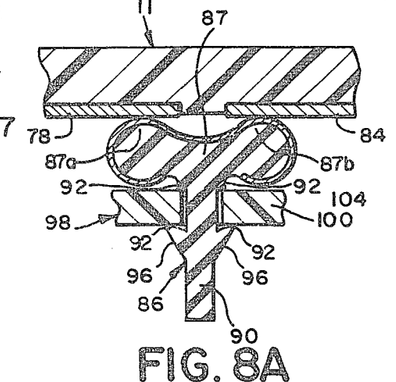
FIG. 8A is a greatly enlarged view of a portion of FIG. 8.
Figure 9:
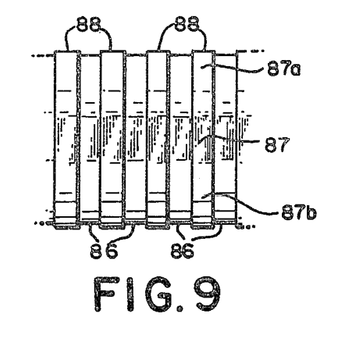
FIG. 9 is an enlarged sectional view of a portion of the switching apparatus taken along line 9—9 of FIG. 8.

In the present embodiment, the switching apparatus 30 is normally closed: that is, the conductor strips 88 normally engage the first and second sets of lands 78 and 84 as shown on FIGS. 8 and 8A to provide electrical connections between the corresponding conductor pairs and thus to interconnect the corresponding pins of the DTE and DCE connectors 16 and 18, respectively. Biasing means, in the present embodiment a pair of spring means or coil springs 106 are provided for normally urging the elastomeric member 86 into its first, closed position contacting the printed circuit board 11. One of the coil springs 106 is positioned around the shank of each of two generally parallel support posts, in this embodiment two shoulder screws 108. The shoulder screws 108 extend completely through suitable openings in the switch apparatus housing 98 the openings being somewhat larger than the screw shanks to permit the housing to move along the screws 108 toward and away from the printed circuit board 11 and to permit limited tilting of housing 98 as hereafter described. The shoulder screws 108 subsequently extend through suitable openings 110 in the printed circuit board 11 and are retained therein by means of suitable nuts 112. Annular shoulders 109 (best seen on FIG. 7) within the shoulder screw openings of the switch apparatus housing 98 are provided to compress the coil springs 106. In this manner, the compressed coil springs 106 act to continuously urge the housing 98 downwardly toward the printed circuit board 11 as described above and into contact with actuator structure later to be described. The combination of the springs 106, shoulder screws 108 and annular shoulders 109 serve as guide means for cooperating with and limited movement of the housing 98.

Actuator means are provided for engaging and moving the switch apparatus housing 98 and the elastomeric member 86 against the bias of the coil springs 106 from a first position in engagement with the printed circuit board 11 to a second position in which the conductor strips 88 are disengaged or separated from at least one of the first and second sets of lands 78 and 84. Thus, in the second position, the switches are open to break electrical connections between the corresponding conductor pairs and, thus, to prevent the interconnection between the corresponding pins of the DTE and DCE connectors 16 and 18, respectively.

In the present embodiment, as shown on FIGS. 1, 2, 5, 6 and 7, the actuator means comprises a generally flat irregularly shaped slide member or actuator 114 which is comprised of a relatively rigid non-conducting material such as plastic. The actuator 114 includes a first pair of generally horizontal drive legs 116 and 118 on a first end 120 thereof. The actuator drive legs 116 and 118 are snugly engaged in and extend through horizontal guide slots 122 and 124, respectively, in the frame member 42 and into DTE and DCE patch plug receptacles 48 and 50, respectively.

The actuator 114 further includes a second pair of cam actuator legs 126 and 128 on the second end 129 thereof. The cam actuator legs 126 and 128 are each supported a predetermined distance above the printed circuit board 11 by the slots 122 and 124 and a pair of roundhead rivets 130 which are fastened to the printed circuit board 11 through suitable openings. A pair of guide shoulders 132, provided by a cut-away portion of the switch apparatus housing 98 and facing the circuit board 11, engage the tops of the cam actuator legs 126 and 128, respectively, and act to hold the cam actuator legs 126 and 128 against with the upper surface of the rivets 130. The upper surfaces of the rivets 130 are positioned the same distance above the surface of the printed circuit board 11 as are the bottoms of the guide slots 122 and 124 for actuator legs 116 and 118 in order to maintain the actuator 114 in a position substantially parallel to the surface of the printed circuit board 11 while allowing the actuator 114 to move laterally back and forth. A spring means or coil spring 136 is attached between the actuator 114 and one of the frame member retaining bolts 44 to urge the drive legs 116 and 118 through the guide slots 122 and 124 and into the plug receptacles 48 and 50, as shown on FIG. 5. Suitable stop means or shoulders on each of the drive legs 116 and 118 engage the frame member 42 in the vicinity of the slots 122 and 124 to prevent the actuator 114 from moving any further toward the right into the plug receptacles 48 and 50 than as is shown on FIGS. 2 and 5.

Figures 4, 7:
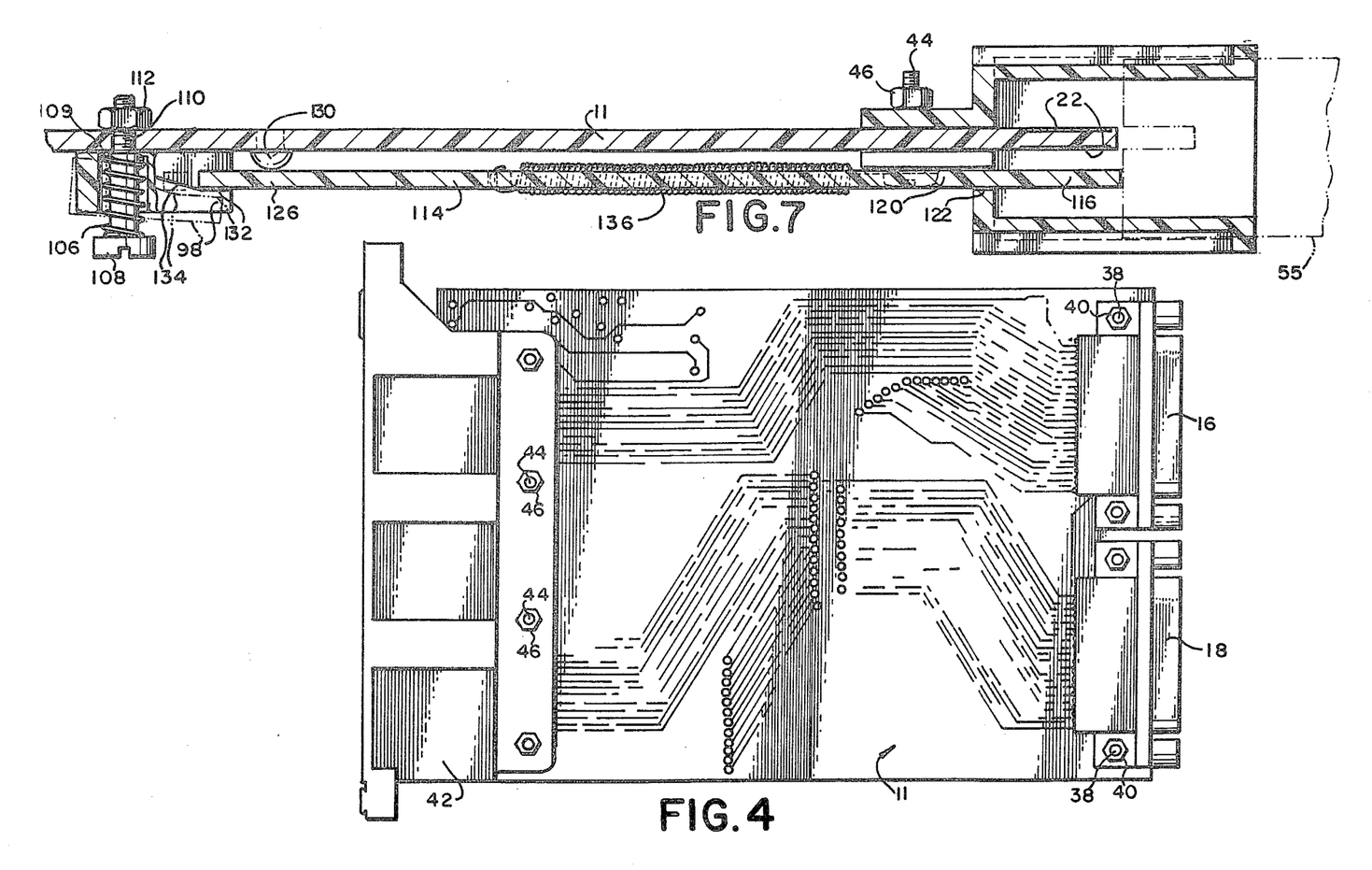
FIG. 4 is a plan view of the patch module unit of FIG. 2 showing the top side of the printed circuit board with the attached connector hardware.
FIG. 7 is a slightly enlarged sectional view of a portion of the patch module unit taken along line 7—7 of FIG. 5 inverted to correspond to the orientation of FIG. 6.

The switch apparatus housing 98 further includes cam surface means or a pair of cam surfaces 134 (only one of which is shown on FIGS. 2, 6, 7 and 8) as extensions of guide shoulders 132. As best seen on FIG. 7, the insertion of a patch cord plug 55 into the DTE patch cord receptacle 48, for eventual engagement with the DTE board edge connector 22, displaces the actuator 114 toward the left against the bias of the spring 136, causing the cam actuator legs 126 and 128 to function as cam follower members and to engage the cam surfaces 134 on the ends of the switch apparatus housing 98. As the patch cord plug 55 moves further into the patch cord receptacle 48, the actuator legs 126 and 128 moving against the camming surfaces 134 force the switch apparatus housing 98 (including the elastomeric member 86) to pivot or tilt upwardly (shown in phantom) about a long axis through the housing, thereby breaking the electrical contact between the conductor strips 88 and the second set of lands 84. The action of the switch apparatus housing 98 in rotating as well as translating upwardly provides a wiping action between the conductor strips 88 and the second set of lands 84 to keep their respective contacting surfaces free of dirt and debris and to thereby provide for better electrical contact when the two are engaged. Of course, once the patch cord plug 55 is removed from the patch cord receptacle 48, the bias of the spring 136 moves the actuator 114 toward the right to the position as shown in FIG. 7. As the actuator moves to the position as shown in FIG. 7, the springs 106 urge the switching apparatus housing 98 downwardly, causing the conductor strips 88 ultimately to again engage both the first and second sets of lands 78 and 84 to interconnect the respective pins of the DTE and DCE EIA RS-232 connectors 16 and 18.

As shown, the actuator 114 operates to break electrical contact between the corresponding pairs of lands only when a patch cord plug 55 is inserted into patch cord receptacle 48 or patch cord receptacle 50, corresponding to the DTE and DCE board edge connectors 22 and 26, respectively. Since the actuator 114 is not in any way connected to the MON patch cord receptacle 52, a patch cord plug 55 may be inserted into the MON patch cord port 52 and connected to the MON board edge connector 28 without effecting the switching apparatus 30.

From the foregoing description and the accompanying figures, it can be seen that the present invention provides a switching apparatus which employs a metalized elastomeric member for simultaneously making or breaking electrical connections between a plurality of pairs of conductors. It will be recognized by those skilled in the art that changes or modifications may be made to the above-described embodiment without departing from the broad inventive concepts of the invention. It is understood, therefore, that this invention is not limited to the particular embodiments shown and described, but it is intended to cover all changes and modifications which are within the scope and spirit of the invention as set forth in the appended claims.

We claim:

1. A switching apparatus for making or breaking a plurality of electrical connections simultaneously, comprising:

a printed circuit board supporting a plurality of generally parallel conductor segments, each conductor segment having aligned first and second electrically conductive tracks separated by an electrically insulating gap such that portions of the tracks adjacent the gaps are in generally parallel columns and the gaps are aligned in a column transverse to the conductor tracks;

switch means provided by an elastomeric member supported on a rigid support member, said elastomeric member having at least a plurality of conductor strips sufficient to and positioned to separately bridge the respective gaps of the supported conductor segments when the elastomeric member is positioned against the printed circuit board;

support posts supported on the printed circuit board for supporting and aligning the support member for the elastomeric member relative to the printed circuit board and for permitting movement of the elastomeric member in the same repeatable pattern time after time toward and away from the printed circuit board such as to cause the conductor strips to contact the printed circuit board in essentially the same position time after time;

spring biasing means acting between the rigid support member for the switch means and the support posts for normally urging the elastomeric member into the printed circuit board so that the conductor strips engaging the conductor segments and bridge the gaps to permit electrical connections through the conductor segments; and actuator means movably supported relative to the printed circuit board and cooperable with the support member for the elastomeric member for moving the elastomeric member against the bias of the spring biasing means away from the printed circuit board and away from the conductor segments.

2. The switching apparatus as recited in claim 1 in which the actuator means is a slide member movable generally parallel to the printed circuit board and having at least one portion cooperating with the rigid support member for the elastomeric member, at least one of the rigid support member and the slide member which cooperate being provided with cam surface member for moving the rigid support means toward or away from the printed circuit board.

3. The switching apparatus as recited in claim 2 in which the slide member has a pair of cam follower members which act upon cam surfaces at opposite ends of the rigid support member adjacent the support posts to move the rigid support means away from the printed circuit board.

4. The switching apparatus as recited in claim 3 in which the cam surfaces and cam follower members are configured to move the rigid support member relative to the printed circuit board when the elastomeric member moves from one position to the other with both rotational and translational motion whereby a wiping action is achieved between the conductor strips and the conductor tracks.

5. The switching apparatus as recited in claim 1 further including plug receptacle means supported relative to the printed circuit board for receiving plug means of a cable connector for connecting conductors of the cable individually to each of a plurality of conductive tracks on the printed circuit board and wherein the actuator means has a portion which extends into the plug receptacle means in a position to be contacted and moved and wherein the actuator has means contacting the support member for the elastomeric member for moving the elastomeric member away from the printed circuit board as a plug means is inserted into the plug receptacle means.

6. The switching apparatus as recited in claim 5 further including spring means between the actuator means and the printed circuit board for urging the actuator means into the plug receptacle means, and stop means between the actuator means and the receptacle means for limiting movement of the actuator means into the plug receptacle means, and wherein the actuator means cooperates with and moves the support member to move the elastomeric member from one position to the other position.

7. The switching apparatus as recited in claim 1 in which the elastomeric member is T-shaped in cross section, a cross-bar of the T being provided at opposite ends with ridges transverse to the conductor segments, the support member engaging the elastomeric member at a point removed from the cross-bar of the T whereby when the elastomeric member moves from one position to the other, the cross-bar of the T flexes to afford a wiping action between the conductor strips at the ridges and the conductor tracks.

* * * * *